(12) United States Patent
Chen

(10) Patent No.: US 11,322,931 B2
(45) Date of Patent: May 3, 2022

(54) DRIVING DEVICE OF DISPLAY PANEL

(71) Applicants: HKC Corporation Limited, Guangdong (CN); Chongqing HKC Optoelectronics Technology Co., Ltd., Chongqing (CN)

(72) Inventor: Yu-Jen Chen, Chongqing (CN)

(73) Assignees: HKC Corporation, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 336 days.

(21) Appl. No.: 16/632,355

(22) PCT Filed: Sep. 20, 2017

(86) PCT No.: PCT/CN2017/102466
§ 371 (c)(1),
(2) Date: Jan. 19, 2020

(87) PCT Pub. No.: WO2019/015076
PCT Pub. Date: Jan. 24, 2019

(65) Prior Publication Data
US 2020/0203946 A1 Jun. 25, 2020

(30) Foreign Application Priority Data
Jul. 21, 2017 (CN) .......................... 201710602849.X

(51) Int. Cl.
*H02H 9/04* (2006.01)
*G09G 3/36* (2006.01)

(52) U.S. Cl.
CPC ............. *H02H 9/04* (2013.01); *G09G 3/3648* (2013.01); *G09G 2330/04* (2013.01)

(58) Field of Classification Search
CPC .......... H02H 9/04; G09G 3/36; G09G 3/3648; G09G 2300/043; G09G 2330/04;
(Continued)

(56) References Cited

U.S. PATENT DOCUMENTS

| 6,195,245 B1 | 2/2001 | Kobsa |
| 6,421,220 B2 | 7/2002 | Kobsa |

(Continued)

FOREIGN PATENT DOCUMENTS

| CN | 1366339 A | 8/2002 |
| CN | 1399336 A * | 2/2003 |

(Continued)

OTHER PUBLICATIONS

International Search Report of PCT Patent Application No. PCT/CN2017/102466 dated Apr. 17, 2018.

*Primary Examiner* — Kevin J Comber

(57) ABSTRACT

The present disclosure provides a driving device of the display panel, which includes a protection circuit in a chip, the protection circuit includes: a plurality of chip input ends; a plurality of first diodes (D1) connected to the plurality of chip input ends in parallel, the cathodes of the first diodes (D1) connect to the chip input ends; a third diode (D3), a cathode of the third diode (D3) connects to an anode of the first diode (D1), an anode of the third diode (D3) is grounded, an area of the third diode (D3) is larger than an area of the first diode (D1), an amount of the third diode (D3) is less than an amount of the first diode (D1).

6 Claims, 5 Drawing Sheets

(58) Field of Classification Search
CPC .......... G09G 2310/027; G02F 1/13306; G02F 1/136204; H05K 9/00
USPC ...................................................... 361/91.5
See application file for complete search history.

(56) References Cited

U.S. PATENT DOCUMENTS

| | | |
|---|---|---|
| 7,518,843 B2 | 4/2009 | Wu et al. |
| 7,990,664 B1 | 8/2011 | Perisetty et al. |
| 2001/0000985 A1 | 5/2001 | Kobsa |
| 2006/0215337 A1 | 9/2006 | Wu et al. |
| 2010/0182296 A1* | 7/2010 | Yaguma ............... G09G 3/3696 345/96 |
| 2012/0218668 A1* | 8/2012 | Kidger ................... H02H 9/005 361/18 |

FOREIGN PATENT DOCUMENTS

| | | | |
|---|---|---|---|
| CN | 1399336 A | 2/2003 | |
| CN | 1841873 A | 10/2006 | |
| CN | 101207283 A | 6/2008 | |
| CN | 101893775 A | 11/2010 | |
| CN | 103441126 A | 12/2013 | |
| CN | 204030579 U | 12/2014 | |
| CN | 205863912 U | 1/2017 | |
| JP | H1010493 A | 1/1998 | |
| JP | 2008288236 A | 11/2008 | |
| WO | 9962158 A1 | 12/1999 | |
| WO | WO-9962158 A1 * | 12/1999 | ............... H02H 9/06 |

* cited by examiner

DRIVING DEVICE OF DISPLAY PANEL

FIELD

The present disclosure generally relates to the technical field of display, and more particularly relates to a driving device of display panel.

BACKGROUND

Thin film transistor liquid crystal display (TFT-LCD) is one of the main products of the current panel displays, and has become an important display platform in Modern IT and video products. The main driving principle of the TFT-LCD is that: a system main board connects the R/G/B compression signal, control signal, and power to a connector on a printed circuit board (PCB) through wires, after the data is processed by a timing controller (TCON) chip on the printed circuit board, the data is transmitted to the display area through the printed circuit board, a source-chip on film (S-COF), and a gate-chip on film (G-COF), to offer the display device with the needed power and signal.

With the continuous increasing of users' requirements for product reliability, product quality, and electronic static discharge (ESD) protection capability and reliability, it is therefore each of the components in the system needs to improve the ESD protection capability. However, the ESD protection capability of the chip is proportional to the area of electrostatic discharge diode, when the area of electrostatic discharge diode is increased, the cost of the chip is also increased.

SUMMARY

The present disclosure provides a driving device of display panel, which can not only improve the chip's electrostatic discharge protection capability, but also control the cost of the driving device of display panel.

A driving device of display panel includes a protection circuit, the protection circuit includes:
 a plurality of chip input ends;
 a plurality of first diodes, the plurality of first diodes connect the corresponding plurality of chip input ends in parallel, the cathodes of the first diodes connect to the chip input ends; and
 a third diode, a cathode of the third diode connects to an anode of the first diode, an anode of the third diode is grounded, an area of the third diode is larger than an area of the first diode, an amount of the third diode is less than an amount of the first diode.

In one of the exemplary embodiments, the area of the third diode is larger than or equal to ten times of the area of the first diode.

In one of the exemplary embodiments, the protection circuit includes a first diode area and a third diode area, the first diode area includes a plurality of first diode connecting in parallel, the third diode area includes one third diode.

In one of the exemplary embodiments, the protection circuit further includes a second diode, the first diode connects to the third diode through the second diode; an anode of the second diode connects to the anode of the first diode, a cathode of the second diode connects to the cathode of the third diode.

In one of the exemplary embodiments, a reverse breakdown voltage value of the second diode is larger than the reverse breakdown voltage values of the first diode and the third diode.

In one of the exemplary embodiments, the reverse breakdown voltage value of the first diode and/or the third diode is 18V-25V, the reverse breakdown voltage value of the second diode is larger than 30V.

In one of the exemplary embodiments, the area of the first diode is equal to the area of the second diode.

In one of the exemplary embodiments, the protection circuit includes a first diode area, a second diode area, and a third diode area, the first diode area includes a plurality of first diodes connecting in parallel, the second diode area includes one second diode or a plurality of second diodes connecting in parallel, the third diode area includes one third diode; the cathodes of the second diodes all connect to the cathode of the third diode.

In one of the exemplary embodiments, the plurality of second diodes are corresponding to the plurality of first diodes, the cathodes of the plurality of second diodes all connect to the cathode of the third diode.

In one of the exemplary embodiments, the driving device of display panel is configured to drive the display panel, the display panel includes a display area and a non-display area located at a periphery of the display area, the driving device includes a plurality of driving chips, the protection circuit is located in at least one of the plurality of driving chips, the plurality of driving chips are located on the non-display area which is on the same side of the display area.

In one of the exemplary embodiments, the plurality of driving chips includes a plurality of source drive chips and at least one gate drive chip.

In one of the exemplary embodiments, the protection circuit is defined in the source drive chip and adjacent to an input end of the source drive chip.

In one of the exemplary embodiments, the protection circuit is defined in the source drive chip and adjacent to an input end of the source drive chip.

A driving device of display panel includes a protection circuit, the protection circuit includes:
 a plurality of chip input ends;
 a first diode area, the first diode area includes a plurality of first diodes, the plurality of first diodes connect the corresponding plurality of chip input ends in parallel, the cathodes of the first diodes connect to the chip input ends;
 a second diode area, the second diode area includes one second diode, an anode of the second diode connects to an anode of the first diode, an area of the first diode is equal to an area of the second diode; and
 a third diode area, the third diode area includes one third diode, a cathode of the third diode connects to a cathode of the second diode, an anode of the third diode is grounded, an area of the third diode is larger than the area of the first diode;
 a reverse breakdown voltage value of the second diode is larger than the reverse breakdown voltage values of the first diode and the third diode.

In one of the exemplary embodiments, the reverse breakdown voltage value of the second diode is larger than the reverse breakdown voltage values of the first diode and the third diode.

In one of the exemplary embodiments, the reverse breakdown voltage value of the first diode and/or the third diode is 18V-25V, the reverse breakdown voltage value of the second diode is larger than 30V.

A driving device of display panel includes a protection circuit, the protection circuit includes:
 a plurality of chip input ends;

a plurality of first diodes, the plurality of first diodes connect the corresponding plurality of chip input ends in parallel, the cathodes of the first diodes connect to the chip input ends;

a second diode, an anode of the second diode connects to an anode of the first diode, an area of the second diode is equal to an area of the first diode; and a third diode, a cathode of the third diode connects to a cathode of the second diode, an anode of the third diode is grounded, an area of the third diode is larger than ten times of an area of the first diode;

a reverse breakdown voltage value of the second diode is larger than the reverse breakdown voltage values of the first diode and the third diode.

In one of the exemplary embodiments, the driving device of display panel is configured to drive the display panel, the display panel comprises a display area and a non-display area located at a periphery of the display area, the driving device includes a plurality of driving chips, the protection circuit is located in at least one of the plurality of driving chips, the plurality of driving chips are located on the non-display area which is on the same side of the display area.

In one of the exemplary embodiments, the plurality of driving chips includes a plurality of source drive chips and at least one gate drive chip.

In the above driving device of display panel, the display device includes the protection circuit, the protection circuit includes: the chip input end, the first diode, and the third diode. The cathode of the first diode connects to the chip input end; the cathode of the third diode connects to the anode of the first diode, the anode of the third diode is grounded, the area of the third diode is larger than the area of the first diode. The area of the third diode is large, and the third diode has higher electrostatic discharge protection capability, when the chip input end receives the electrostatic discharge signal, causing that the first diode is reversely penetrated, the energy of the electrostatic discharge signal reversely penetrates the third diode having high electrostatic discharge protection capability again, finally, the energy is transmitted to ground, so as to improve the electrostatic discharge protection capability. The amount of the third diode is less than the amount of the first diode, the amount of the second diode is reduced, as such the total area of the diodes in the chip is effectively reduced, thereby the cost is under control.

BRIEF DESCRIPTION OF THE DRAWINGS

To better illustrate the technical solutions that are reflected in various embodiments according to this disclosure or that are found in the prior art, the accompanying drawings intended for the description of the embodiments herein or for the prior art will now be briefly described, it is evident that the accompanying drawings listed in the following description show merely some embodiments according to this disclosure, and that those having ordinary skill in the art will be able to obtain other drawings based on the arrangements shown in these drawings without making inventive efforts.

DETAILED DESCRIPTION

In order to make the aim, technical solutions, advantages of the present disclosure more clear, the present disclosure is further described specifically with reference to the accompanying drawings and embodiments. It is to be understood that, the example embodiments of the present disclosure and their corresponding descriptions are used for illustrating the present invention rather than restricting the present disclosure.

Figure 1:
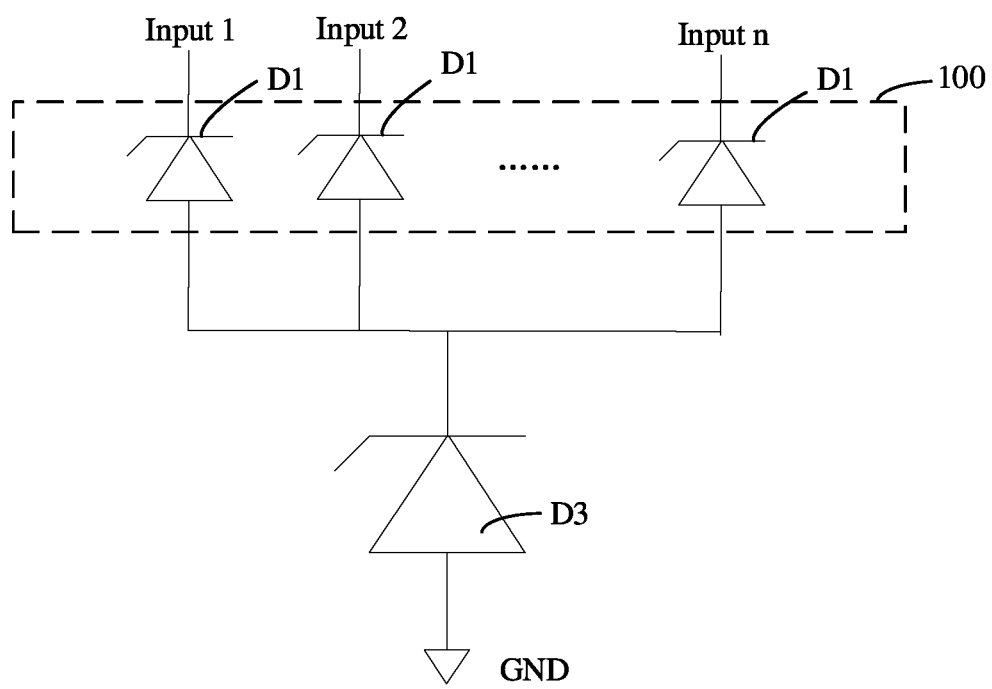
FIG. 1 is a diagram of the protection circuit of the driving device of display panel according to an exemplary embodiment.

FIG. 1 is a diagram of the protection circuit of the driving device of display panel, the protection circuit includes a plurality of chip input ends, a plurality of first diode D1, and a third diode D3. The plurality of first diodes D1 connected to the plurality of chip unit ends in parallel, a cathode of the first diode D1 connects to the chip input end; a cathode of the third diode D3 connects to an anode of the first diode D1, an anode of the third diode D3 is grounded, an area of the third diode D3 is larger than an area of the first diode D1, an amount of the third diode D3 is less than an amount of the first diode D1.

The area of the third diode D3 is large, and the third diode D3 has higher electrostatic discharge protection capability, when the chip input end receives the electrostatic discharge signal, causing that the first diode D1 is reversely penetrated, the energy of the electrostatic discharge signal reversely penetrates the third diode D3 having high electrostatic discharge protection capability again, finally, the energy is transmitted to ground, so as to improve the electrostatic discharge protection capability. The amount of the third diode is less than the amount of the first diode, the amount of the second diode is reduced, as such the total area of the diodes in the chip is effectively reduced, thereby the cost is under control. For example, there can be one third diode D3, two third diodes D3, or three third diodes D3, etc. The present disclosure adopts less third diodes D3 to reduce the volume of the chip and the cost. The protection circuit is mainly located in the source drive chip, the source drive chip matches with the gate drive chip to drives the display sub-pixels in the display panel.

The first diode D1 can be defined on the input end of the chip, which needs to stand against electrostatic discharge, according to the requirement, then the chip is provided with one or more third diode D3 having a large size. The first diode D1 and the third diode D3 are both defined in the chip and adjacent to the input end of the chip.

Furthermore, the area of the third diode can be set to be larger than five times of the area of the first diode, in order to achieve much better electrostatic discharge protection ability, the area of the third diode can be set to be larger than eight, ten, fifteen, or twenty times of the area of the first diode, etc. In order to achieve much better electrostatic discharge protection ability, and in consideration of cost, the area of the third diode can be set to be larger than ten times of the area of the first diode.

In detail, the protection circuit includes a first diode area 100 and a third diode area, the first diode area 100 includes a plurality of first diodes D1 which are connected in parallel, the third diode area can be one third diode D3. The plurality of first diodes D1, connected to the plurality of input ends of the protection circuit, share one third diode D3 having the large size and high electrostatic discharge protection ability, as such the electrostatic discharge protection ability of the protection circuit can be improved, and simultaneously the rising of the cost is effectively controlled. The amount of the first diode D1 in the first diode area 100 corresponds to the amount of the input end of the chip, the area of the first diode area 100 is a total area of the plurality of first diodes D1 combined. The total area of the first area and the second area is smaller than the area of the traditional designed first area, that is, in the traditional first area, the area of each of the first diodes becomes smaller, allowing the first area becomes smaller accordingly, then one third diode having large area can be added, as such the total area of a plurality of first diodes and a plurality of third diodes combined is smaller than the total area of the plurality of traditional designed first diodes. Therefore, not only each of the input ends has much higher electrostatic discharge protective ability, but also the total occupied space is smaller, and the cost is saved.

Figure 2:
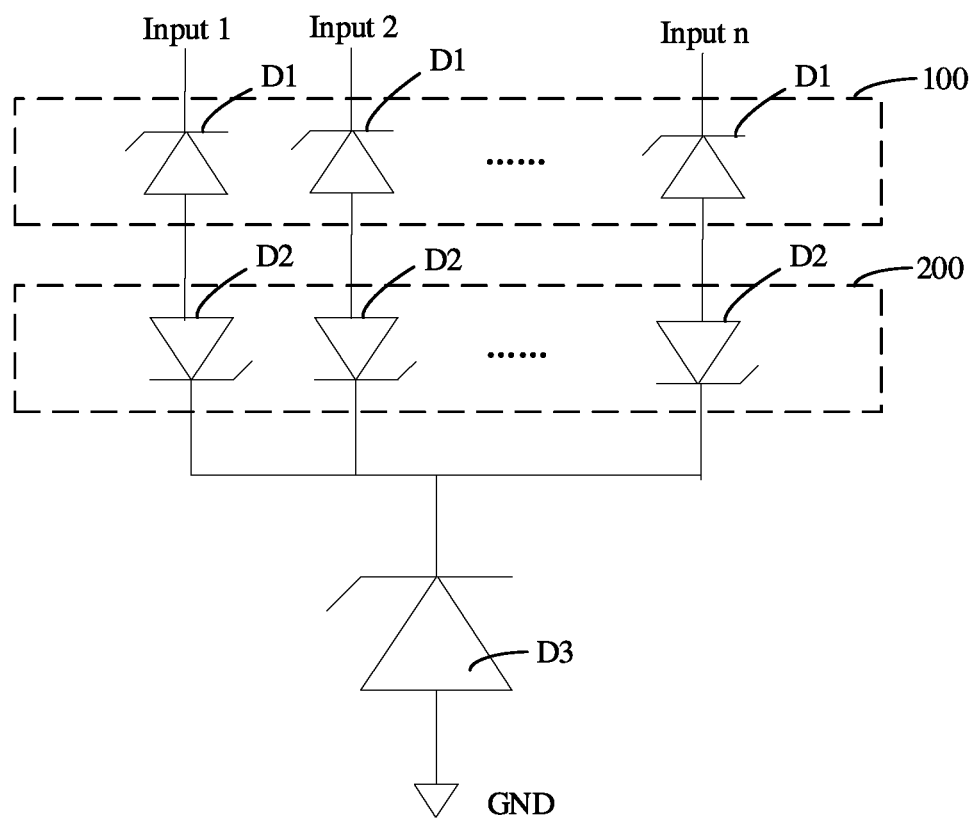
FIG. 2 is a diagram of the protection circuit according to another exemplary embodiment.

FIG. 2 is a diagram of the protection circuit according to another exemplary embodiment, the main difference between the exemplary embodiment and the foregoing exemplary embodiment is that: the protection circuit further includes a second diode D2, in detail, the first diode D1 connects to the third diode D3 through the second diode D2; an anode of the second diode D2 connects to the anode of the first diode D1, a cathode of the second diode D2 connects to the cathode of the third diode D3. The reversed third diode D2 can be used to isolate the input end, the electrostatic discharge energy would not flow back to the input end, and would reversely penetrate the third diode D3 having high electrostatic discharge protective ability, and finally transmit to the ground.

A reverse breakdown voltage value of the second diode is larger than the reverse breakdown voltage values of the first diode and the third diode. When designing the first diode and the third diode, the first diode and the third diode are designed to have lower reverse breakdown voltage values, and the third diode has higher reverse breakdown voltage value. When the input end gets the electrostatic discharge signal, after the first diode is reversely penetrated, the electrostatic discharge energy would pass through the corresponding second diode forwardly, at this time, as the reverse breakdown voltage value of the third diode is much higher, the electrostatic discharge energy would not flow back to the input end, but would reversely penetrate the third diode having higher electrostatic discharge protective ability, and finally transmit to the ground, such the protection circuit has the electrostatic discharge protection capability. In detail, the reverse breakdown voltages of the first diode and the third diode can be set according to the requirement, for example, the reverse breakdown voltage value of the first diode can be 18V, 20V, 22V, or 25V, etc. The reverse breakdown voltage value of the third diode can be 18V, 20V, 22V, or 25V, etc. The reverse breakdown voltage values of the first diode and the third diode can be the same or different, for example, the reverse breakdown voltage value of the third diode is lower than the reverse breakdown voltage value of the first diode, which is benefit for the electrostatic discharge energy transmitting to the ground through the third diode. The reverse breakdown voltage of the second diode can be set according to the requirement, for example, the reverse breakdown voltage value of the second diode can be greater than 30V, or greater than 40V.

Furthermore, the area of the first diode is equal to the area of the second diode, which is convenient for production. Of course, according to the requirement, the area of the first diode can be set to be different from the area of the second diode.

In detail, referring to FIG. 2, the protection circuit includes a first diode area 100, a second diode area 200, and a third diode area, the first diode area 100 includes a plurality of first diodes D1 which are connected in parallel, the second diode area 200 includes a plurality of second diodes arranged D2 arranged in parallel, the third diode area can be one third diode D3. The cathodes of the second diodes D2 all connect to the cathode of the third diode D3. There can be a plurality of second diodes D2, for preventing the electrostatic discharge energy from flowing back to the input end of the chip. Furthermore, the plurality of second diodes D2 corresponds to the plurality of first diodes D1, the cathodes of the plurality of second diodes D2 all connect to the cathode of the third diode D3. As such preventing the electrostatic discharge energy from flowing back to each of the input ends of the chips. The first diode area 100, the second diode area 200, and the third diode area are both defined in the chip and adjacent to the input end of the chip. The total area of the first area, the second area, and the third area is smaller than the area of the traditional designed first area and the second area, that is, in the traditional first area, the area of each of the first diodes becomes smaller, allowing the first area becomes smaller accordingly, then one third diode having large area can be added, as such the total area of a plurality of first diodes and a plurality of third diodes combined is smaller than the total area of the plurality of traditional designed first diodes. Therefore, not only each of the input ends has much higher electrostatic discharge protective ability, but also the total occupied space is smaller, and the cost is saved.

Figure 3:
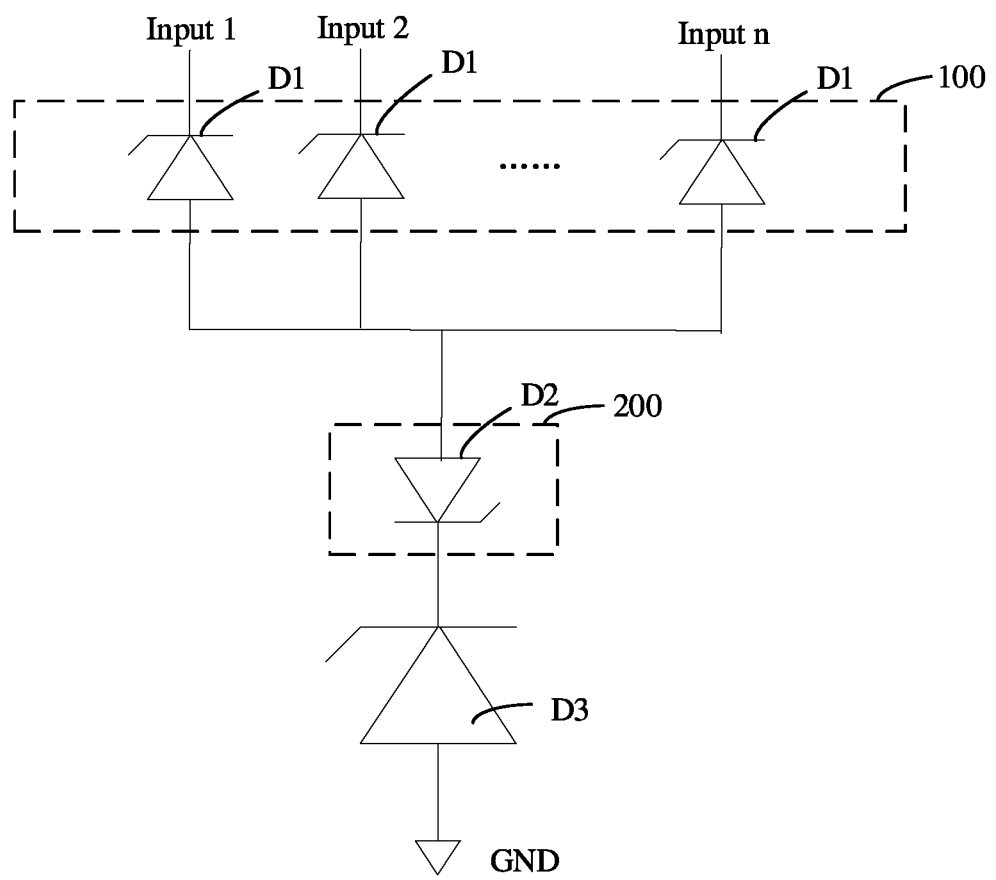
FIG. 3 is a diagram of the protection circuit according to another exemplary embodiment.

In an exemplary embodiment, referring to FIG. 3, the protection circuit includes a first diode area 100, a second diode area 200, and a third diode area, the first diode area 100 includes a plurality of first diodes D1 which are connected in parallel, the second diode area 200 includes one second diode, the third diode area can be one third diode D3. The anodes of the first diodes D1 all connect to the anode of the second diode D2, the cathode of the second diode D2 connects to the cathode of the third diode D3. Through setting one second diode D2, the electrostatic discharge energy can be prevented from flowing back to the input end of the chip. The first diode area 100, the second diode area 200, and the third diode area are both defined in the chip and adjacent to the input end of the chip.

The amount of the first diode D1 in the first diode area 100 corresponds to the amount of the input end of the chip, the area of the second diode D2 is equal to the area of the first diode D1, the area of the first diode area 100 is a total area of the plurality of first diodes D1 combined, the area of the second diode area 200 is a total area of the plurality of second diodes D2 combined.

Figure 4:
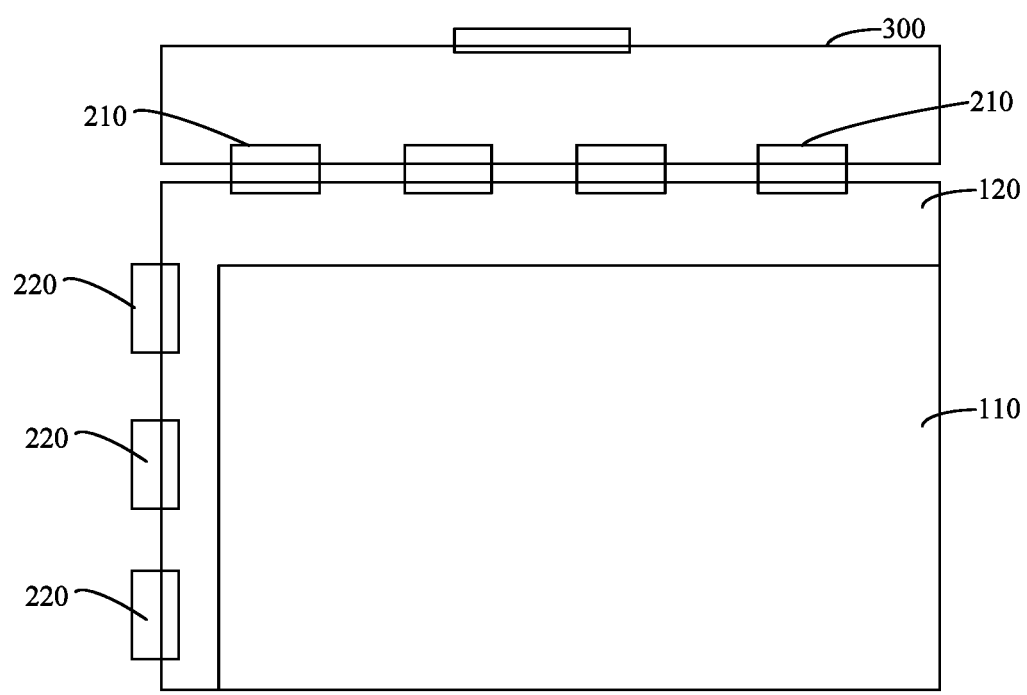
FIG. 4 is a structure diagram of the display device according to an exemplary embodiment.

FIG. 4 is a structure diagram of the display device, the display device includes a display panel and the driving device as described in any one of the foregoing exemplary embodiments. In detail, the display panel can include a display area 110 and a non-display area 120, the display area 110 includes a plurality of display sub pixels, a plurality of thin film transistors (TFT), a plurality of data lines, and a plurality of gate lines, the plurality of display sub pixels are arranged in a matrix mode, the plurality of thin film transistors are configured to drive the display sub pixel connected with the thin film transistor to display the image, the plurality of data lines are arranged along the vertical direction, the plurality of scan lines are set along the horizontal direction, the plurality of data lines matches to the scan lines to drive the thin film transistor to display the image. The driving device includes source drive chip and gate drive chip. The source drive chip and/or gate drive chip include the protection circuit as described in any one of the exemplary embodiments. The protection circuit can be arranged in the source drive chip and adjacent to the input end of the source drive chip, similarly, the protection circuit can be defined in the gate drive chip and adjacent to the input end of the gate drive chip.

The non-display area 120 is a preset area which surrounds the boundary line of the display area 110, a plurality of source drive chips 210 are arranged in the non-display area 120 along the vertical direction to control the data line, and a plurality of gate drive chips 220 are arranged in the non-display area 120 along the horizontal direction to control the scan line. The display device further defines a printed circuit board 300 corresponding to the source drive chip 210, the printed circuit board 300 defines a timing controller, after the timing controller processes the display image signal, the control signal, the timing controller connects to the display area 110 through the source drive chip 210 and the gate drive chip 220, allowing the display area 110 to acquire the required display signal.

The signals transmitting to the display area by the timing controller after the timing controller processes the display image signal and the control signal, can be R, G, B data signals, a clock signal, a vertical synchronizing signal, a horizontal synchronizing signal, etc. The timing controller can transmit the R, G, B data signals, a line start signal, a latch signal, and so on, to the source drive chip, and can transmit a column start signal, a column clock signal, and an output enable signal to the gate drive chip.

The source drive chip further includes a plurality of chip output ends, each of the chip output ends connects to one data line to transmit the data signals to corresponding data lines, each of the chip output ends defines an operational amplifier which is configured to amplify the data signal. The source drive chip further includes a controller, the controller is configured to control an amplitude of the output current of the operational amplifier corresponding to the data signal output end. The timing controller further transmits the preset signal to the controller, the controller controls the amplitude of the output current of the operational amplifier according to the preset signal.

The gate drive chip includes a plurality of gate scan signal output ends, each of the gate scan signal output ends connects to one gate electrode scan line to transmit the ate scan signals to corresponding gate electrode scan lines, each of the gate electrode scan lines electrically connects to the gate electrode of the thin film transistor of the corresponding display sub pixel to switch on/switch off the thin film transistor. Each of the data lines electrically connects to the source electrode of the thin film transistor of the corresponding display sub pixel, and transmits the data signal to the display sub pixel through the thin film transistor. Each of the gate scan signal output ends defines an operational amplifier which is configured to amplify the signal. In detail, when the gate electrode scan line switches on the thin film, the data signal on the data line would be transmitted to the display sub pixel through the thin film transistor. The timing controller can control the gate electrode scan line to switch on a row of thin film transistor row-by-row, and then can control the data line to transmit the data signals to corresponding display sub pixel column by column; as such the data signal can be transmitted to each of the display pixel in the display area, finally forming the image that needs to be displayed.

The foregoing display image signal can be a R/G/B compression signal, a R/G/B/W compression signal, or a R/G/B/Y compression signal.

The display panel can be, but not limited to, twisted nematic (TN) liquid crystal display panel, optically compensated birefringence (OCB) liquid crystal display panel, vertical alignment (VA) liquid crystal display panel. The display panel can be, but not limited to, a red-green-blue (RGB) color panel, a red-green-blue-white (RGBW) color panel, or a red-green-blue-yellow (RGBY) color panel. The display panel can also be a curved panel.

In some exemplary embodiment, the display panel can be an organic light emitting diode (OLED) display panel, a quantum dot light emitting diode QLED display panel, a curved display panel, or other display pane.

Figure 5:
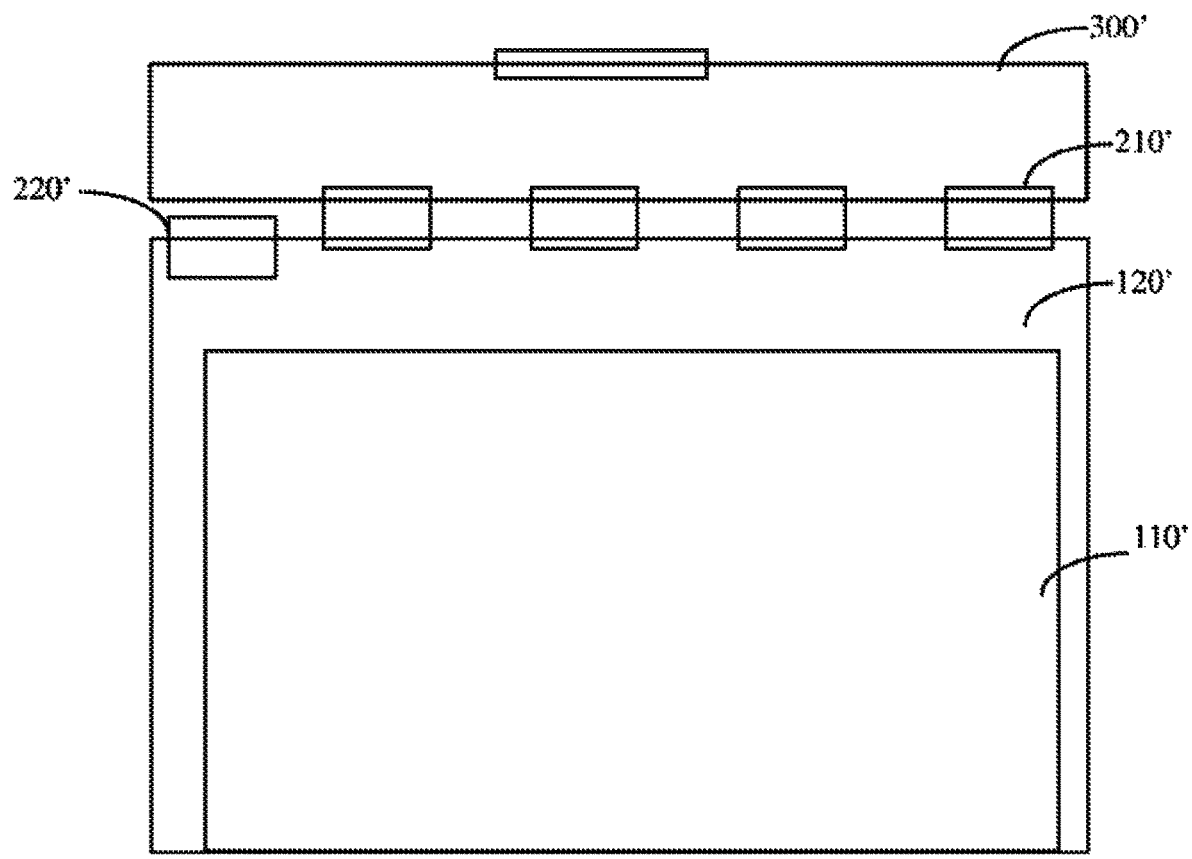
FIG. 5 is a structure diagram of the display device according to another exemplary embodiment.

FIG. 5 is a structure diagram of another display device, the another display device is similarly to the foregoing display device, which includes a display panel and the driving device as described in any one of the foregoing exemplary embodiments. In detail, the display panel can include a display area 110' and a non-display area 120', the display area 110' includes a plurality of display sub pixels, a plurality of thin film transistors (TFT), a plurality of data lines, and a plurality of gate lines, the plurality of display sub pixels are arranged in a matrix mode, the plurality of thin film transistors are configured to drive the display sub pixel connected with the thin film transistor to display the image, the plurality of data lines are arranged along the vertical direction, the plurality of scan lines are set along the horizontal direction, the plurality of data lines matches to the scan lines to drive the thin film transistor to display the image. The driving device includes a source drive chip and a gate drive chip. The source drive chip and/or gate drive chip include the protection circuit as described in any one of the exemplary embodiments. The protection circuit can be arranged in the source drive chip and adjacent to the input end of the source drive chip, similarly, the protection circuit can be defined in the gate drive chip and adjacent to the input end of the gate drive chip.

The non-display area 120' is a preset area which surrounds the boundary line of the display area 110', a plurality of source drive chips 210' and at least one gate drive chip 220' are arranged in the non-display area 120' located at the same side of the display panel (non-display area 120' along the vertical direction in the figure). The source drive chips 210' is configured to control the data line, the gate drive chip 220' is configured to control the scan line. The display device further defines a printed circuit board 300' corresponding to the source drive chip 210', the printed circuit board 300' defines a timing controller, after the timing controller processes the display image signal, the control signal, the timing controller connects to the display area 110' through the source drive chip 210' and the gate drive chip 220', allowing the display area 110' to acquire the required display signal.

In the exemplary embodiment, the source drive chip 210' and the gate drive chip 220' are arranged at the non-display area 120' located at the same side of the display panel 110', and the source drive chip 210' and the gate drive chip 220' are successively arranged along the side of the display area 110' in parallel. The display panel has a rod-like structure, the source drive chip 210' and the gate drive chip 220' are located at the non-display area 120' at the horizontal side of the display area 110' in sequence (that is, the source drive chip 210' and the gate drive chip 220' are located at the non-display area 120' along the length direction of the display area). The non-display areas 120' respectively located at other three sides of the display area 110' do not reserve a position for the chip. In FIG. 5, the non-display areas 120' respectively located at other three sides of the display area 110' do not need to set the control chip, as such the width of the corresponding non-display area 120' can be decreased to the preset dimension according to the requirement, to realize the development requirement for narrow borders. At the same time, the source drive chip 210' and the gate drive chip 220' are arranged at the non-display area 120' located at the same side of the display area 120', the source drive chip 210' and the gate drive chip 220' can be manufactured in one same bonding process to reduce one bonding process, as such the cost is reduced and the production efficiency is improved.

Various technical features of the above embodiments can be combined in any manner. For clarity of description, all possible combinations of various technical features of the above embodiments are not described. However, as long as combinations of these technical features do not contradict with each other, they should be regarded within the scope described in the present specification.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A driving device of display panel, comprising a protection circuit, wherein, the protection circuit comprises:
    a plurality of chip input ends;
    a first diode area, the first diode area comprises a plurality of first diodes, the plurality of first diodes connect the corresponding plurality of chip input ends in parallel, the cathodes of the first diodes connect to the chip input ends;
    a second diode area, the second diode area comprises one second diode, an anode of the second diode connects to an anode of the first diode, an area of the first diode is equal to an area of the second diode; and
    a third diode area, the third diode area comprises one third diode, a cathode of the third diode connects to a cathode of the second diode, an anode of the third diode is grounded, an area of the third diode is larger than the area of the first diode;
    wherein, a reverse breakdown voltage value of the second diode is larger than reverse breakdown voltage values of the first diode and the third diode.

2. The driving device according to claim 1, wherein, the reverse breakdown voltage value of the second diode is larger than the reverse breakdown voltage values of the first diode and the third diode.

3. The driving device according to claim 2, wherein, the reverse breakdown voltage value of the first diode and/or the third diode is 18V-25V, the reverse breakdown voltage value of the second diode is larger than 30V.

4. A driving device of display panel, comprising a protection circuit, the protection circuit comprising:
    a plurality of chip input ends;
    a plurality of first diodes, the plurality of first diodes connecting the corresponding plurality of chip input ends in parallel, the cathodes of the first diodes connecting to the chip input ends; and
    a second diode, an anode of the second diode connecting to an anode of the first diode, an area of the second diode equating with an area of the first diode; and
    a third diode, a cathode of the third diode connecting to a cathode of the second diode, an anode of the third diode being grounded, an area of the third diode being larger than ten times of an area of the first diode;
    wherein, a reverse breakdown voltage value of the second diode is larger than reverse breakdown voltage values of the first diode and the third diode.

5. The driving device according to claim 4, wherein, the driving device of display panel is configured to drive the display panel, the display panel comprises a display area and a non-display area located at a periphery of the display area, the driving device comprises a plurality of driving chips, the protection circuit is located in at least one of the plurality of driving chips, the plurality of driving chips are located on the non-display area which is on the same side of the display area.

6. The driving device according to claim 5, wherein, the plurality of driving chips comprises a plurality of source drive chips and at least one gate drive chip.

* * * * *

UNITED STATES PATENT AND TRADEMARK OFFICE
CERTIFICATE OF CORRECTION

PATENT NO. : 11,322,931 B2
APPLICATION NO. : 16/632355
DATED : May 3, 2022
INVENTOR(S) : Yu-Jen Chen It is certified that error appears in the above-identified patent and that said Letters Patent is hereby corrected as shown below:

On the Title Page

In Item (73) Assignee, the correct assignees should be "HKC Corporation Limited, Shenzhen (CN); Chongqing HKC Optoelectronics Technology Co., Ltd., Chongqing (CN)".

Signed and Sealed this
Twenty-third Day of August, 2022

Katherine Kelly Vidal
*Director of the United States Patent and Trademark Office*